US008473535B2

(12) United States Patent
Perumana et al.

(10) Patent No.: US 8,473,535 B2
(45) Date of Patent: Jun. 25, 2013

(54) HIGH-SPEED PULSE SHAPING FILTER SYSTEMS AND METHODS

(75) Inventors: Bevin George Perumana, Atlanta, GA (US); Arun Rachamadugu, Atlanta, GA (US); Stephane Pinel, Atlanta, GA (US); Joy Laskar, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1146 days.

(21) Appl. No.: 12/327,279

(22) Filed: Dec. 3, 2008

(65) Prior Publication Data

US 2009/0140784 A1 Jun. 4, 2009

Related U.S. Application Data

(60) Provisional application No. 60/991,830, filed on Dec. 3, 2007.

(51) Int. Cl.
*G06F 17/10* (2006.01)
(52) U.S. Cl.
USPC .......................................... 708/300
(58) Field of Classification Search
None
See application file for complete search history.

(56) References Cited

U.S. PATENT DOCUMENTS

| | | | | |
|---|---|---|---|---|
| 5,563,819 A | * | 10/1996 | Nelson | 708/819 |
| 5,808,574 A | * | 9/1998 | Johnson et al. | 341/110 |
| 5,910,960 A | | 6/1999 | Claydon et al. | |
| 7,046,723 B2 | * | 5/2006 | Schier et al. | 375/229 |
| 7,107,301 B2 | * | 9/2006 | Rylov et al. | 708/313 |
| 2003/0231038 A1 | | 12/2003 | Koch, II et al. | |

* cited by examiner

*Primary Examiner* — David H Malzahn
(74) *Attorney, Agent, or Firm* — Dustin B. Weeks, Esq.; Ryan A. Schneider, Esq.; Troutman Sanders, LLP

(57) ABSTRACT

A first system and method relates to an analog current-mode method using branch systems. In the analog current-mode implementation, multiple branches systems can be scaled according to filter coefficients and switched using known data points. Positive coefficients can add current to the summing node, while negative coefficients can remove current from the summing node. Switches can be implemented with quick charge/discharge paths in order to operate at very high data rates. A second system and method relates to a digital look-up table based high-speed implementation. In the digital implementation, outputs can be pre-calculated as an n-bit output word that drives an n-bit DAC. Each bit of the n-bit word can then described as an independent function of the known data points. Each such function can be implemented as a high-speed combinational logic block. Both systems and methods enable the implementation of pulse shaping filters for multi-gigabit per second data transmission.

14 Claims, 11 Drawing Sheets

US 8,473,535 B2

HIGH-SPEED PULSE SHAPING FILTER SYSTEMS AND METHODS

CROSS REFERENCE TO RELATED APPLICATION

This application claims the benefit under 35 U.S.C. §119 (e) of U.S. Provisional Patent Application No. 60/991,830, filed on 3 Dec. 2007, the entire contents and substance of which is hereby incorporated by reference as if fully set forth below.

BACKGROUND

Pulse shaping filters are filters used in digital communications. In digital telecommunications, for instance, pulse shaping is the process of altering a waveform of transmitted pulses. One purpose of a pulse shaping filter is to change the transmitted signal to suit better communication channels by limiting the effective bandwidth of the transmission. In essence, by filtering the transmitted pulses, the interference caused by the channel can be controlled and/or reduced.

In addition, pulse shaping is used to increase transmission data rates without increasing the bandwidth or the bit error rate of the signal. Preferably, the pulse shape used for transmission has a low bandwidth and no inter-symbol interference (ISI). A sinc function includes both of these properties and thus can significantly increase spectral efficiency. A system using sinc functionality for pulse shaping can be susceptible to timing jitter—thus is not practical—and is challenging to precisely implement. A rectangular wave, on the other hand, is not sensitive to timing jitter, but requires a large bandwidth. Commonly-used pulse shapes, such as raised cosine, can provide a compromise between the two extremes of the sinc function and the rectangular wave.

With the advent of multi-media streaming and other high data throughput applications, the required speed of operation of pulse shaping filters is growing. Conventional finite impulse response (FIR) implementations are no longer sufficient to meet these requirements.

For example, FIG. 1 illustrates a block diagram of a conventional pulse shaping filter 10 having an upsampling factor of 2, which is capable of operating up to a few mega bits per second (Mbps). The pulse shaping filter 10 of FIG. 1 includes a delay system 20, a multiplier system 40, and an adding system 60.

The pulse shaping filter 10 can receive an input signal 12. Upon receipt, the input signal 12 is delayed by a predetermined number of delays blocks with delays of half the symbol rate 24 of the delay system 20. As illustrated in FIG. 1, the delays 24 are chained together to make up the delay system 20. Each tap 22, after going through the delay 24, is output to a multiplier 42 of the multiplier system 40. Each multiplier 42 receives both a coefficient (i.e., $c_i$) and a signal 26 from the different delayed versions of the input signal 12. The multiplier 42 multiples the coefficient (i.e., $c_i$) by the signal 26 received from the delay 24. Each of the outputs 44 of the multiplier 42 are input into the adding system 60, which then sums for an output 16 of the PSF 10.

Considering that a 13-tap raised cosine filter for a 2 giga bits per second (Gbps) wireless transmission having an upsampling factor of two the filter has to operate at 4 Giga Hertz (GHz). Unfortunately, a digital FIR implementation using multipliers and adders is not possible; it requires challenging multiplication which takes excessive power and due to the mathematics necessary for calculations will delay processing. Alternate filter implementations are required which can support such high data-rates.

SUMMARY

A first system and method relates to an analog current-mode method using branch systems. In the analog current-mode implementation, multiple branches systems can be scaled according to filter coefficients and switched using known data points. Positive coefficients can add current to the summing node, while negative coefficients can remove current from the summing node. Switches can be implemented with quick charge/discharge paths in order to operate at very high data rates. A second system and method relates to a digital look-up table based high-speed implementation. In the digital implementation, outputs can be pre-calculated as an n-bit output word that drives an n-bit DAC. The digital implementation is accomplished by splitting the processing paths into two paths, which effectively reduces the size of the lookup table from $2^m$ to $2^{(m-1)/2}$ for an m-tap filter implementation. Each bit of the n-bit word can then described as an independent function of the known (m−1)/2 data points. Each such function can be implemented as a high-speed combinational logic block. Both systems and methods enable the implementation of pulse shaping filters for multi-gigabit per second data transmission.

These and other objects, features, and advantages of embodiments of the present invention will become more apparent upon reading the following specification in conjunction with the accompanying drawing figures.

DETAILED DESCRIPTION

Figure 1:
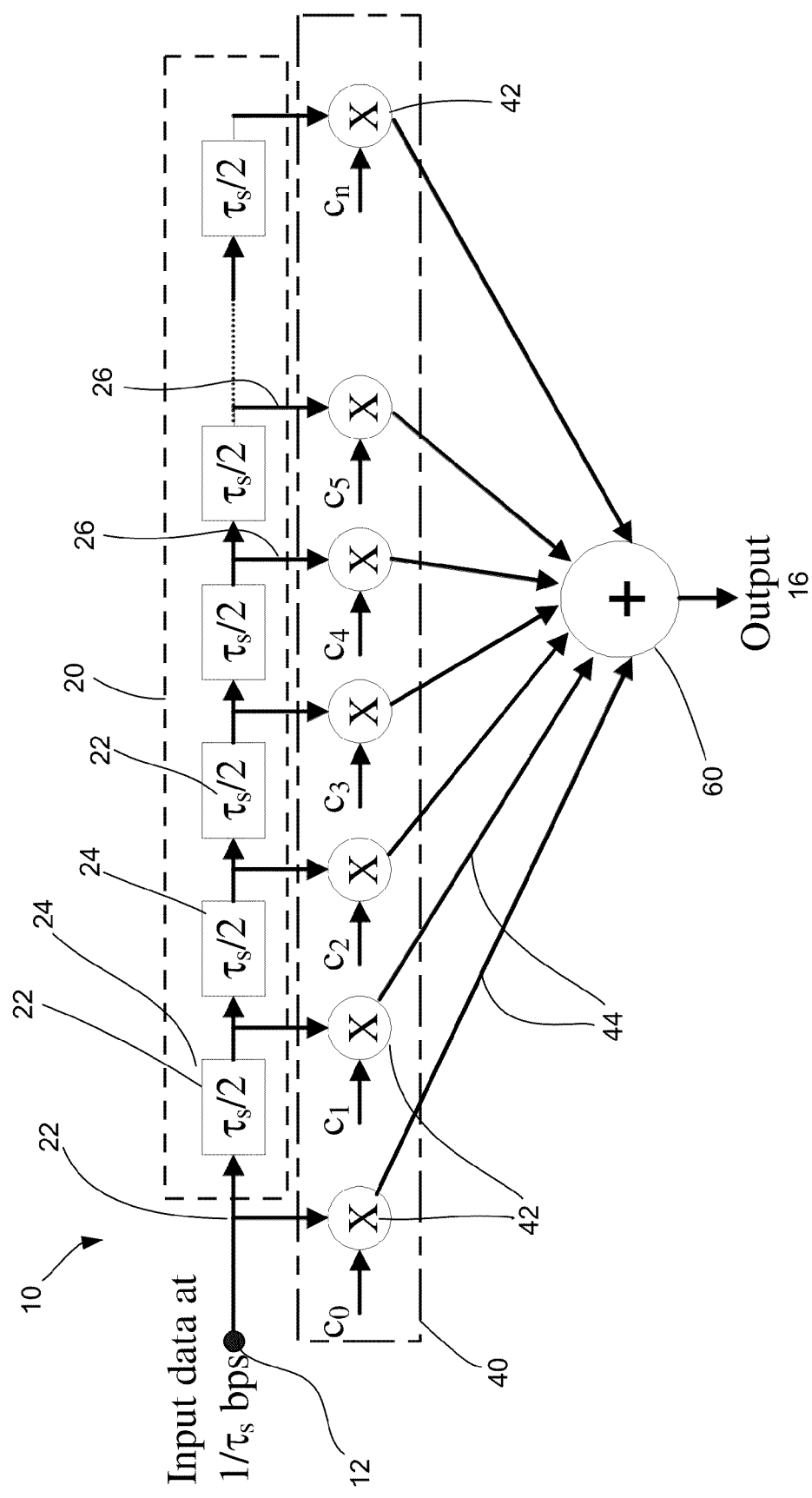
FIG. 1 is a block diagram of a conventional pulse shaping filter.

To facilitate an understanding of the principles and features of various embodiments of the present invention, they are explained hereinafter with reference to their implementation in an illustrative embodiment. In particular, illustrative embodiments of the invention are described in the context of being a pulse shaping filter.

For example, at least two systems and methods to implement high-speed pulse shaping filters are disclosed herein. A first system and method relates to an analog current-mode method using branch systems, i.e., switched current-mirrors. A second system and method relates to a digital look-up table based high-speed implementation. Both of these methods enable the implementation of pulse shaping filters for multi-gigabit per second data transmission.

In the analog current-mode implementation, multiple current mirror branches can be scaled according to the filter coefficients and switched using present and prior data points. Positive coefficients are implemented as branches that add can current to the summing node, while negative coefficients are implemented as branches that can remove current from the summing node. The switches can be implemented with quick charge/discharge paths in order to operate at very high data rates.

In the digital implementation, the outputs can be pre-calculated as an n-bit output word that drives an n-bit digital-to-analog converter (DAC). Each bit of the n-bit word can then described as an independent function of the present and prior data points. Each such function can be implemented as a high-speed combinational logic block. Splitting the coefficients into two sets (even and odd) reduces the size of the lookup table by approximately half.

Embodiments of the invention are not, however, limited to a pulse shaping filter. Embodiments of the present invention can be used to provide a filter system.

The materials and components described hereinafter as making up the various elements of the present invention are intended to be illustrative and not restrictive. Many suitable materials and components that would perform the same or a similar function as the materials and components described herein are intended to be embraced within the scope of the invention. Further, such other materials not described herein can include, but are not limited to, materials that are developed after the time of the development of the invention, for example.

Referring now to the figures, wherein like reference numerals represent like parts throughout the view, embodiments of the present invention will be described in detail.

As illustrated in FIGS. 2-5, exemplary embodiments of the present invention relate to a system and method of implementing a pulse shape filter 100 in the analog domain. The system and method builds from the blocks of the conventional pulse shape filter, i.e., at least an input signal, a delay system, a multiplier system, and an adder system.

Figure 2:
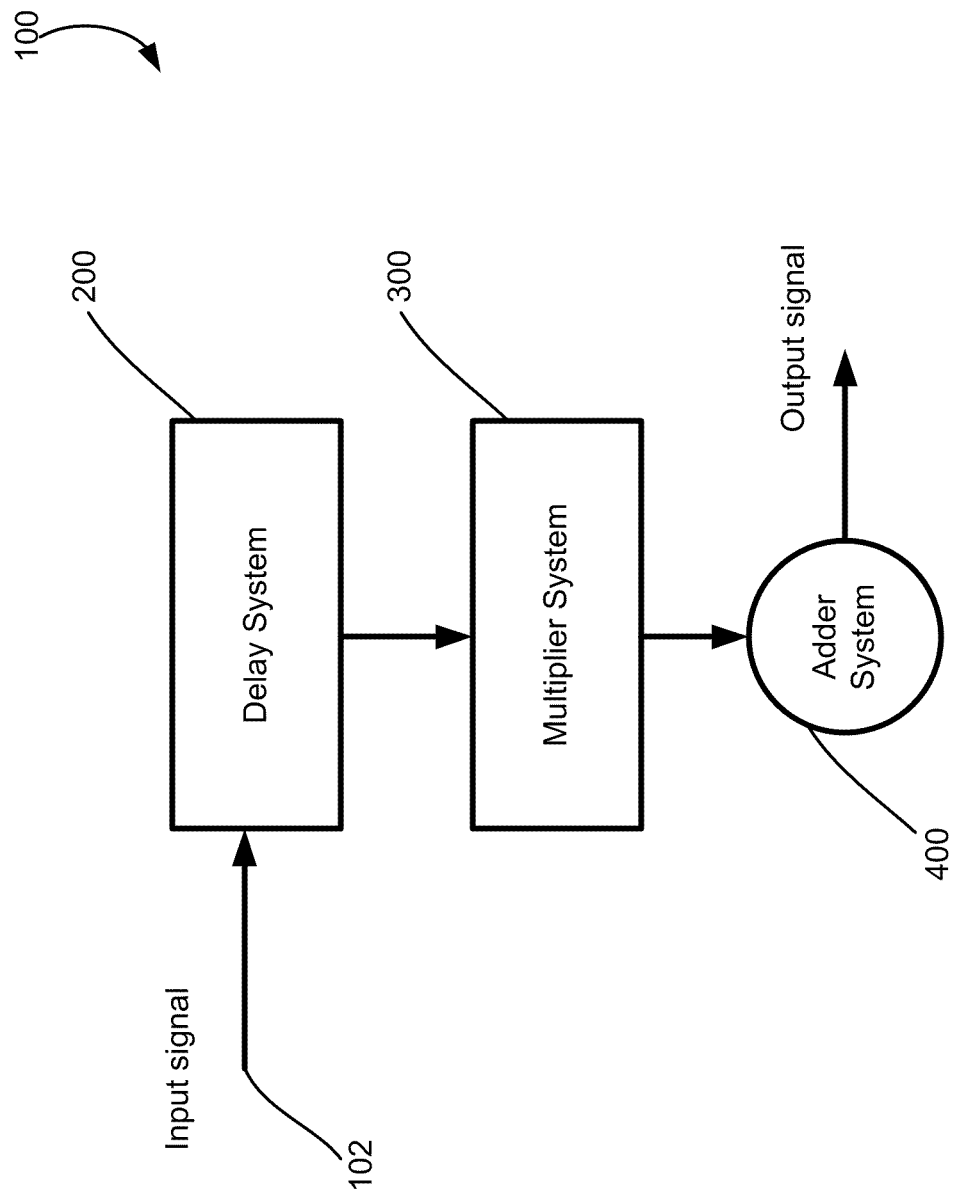
FIG. 2 is a block diagram of a pulse shaping filter, in accordance with an exemplary embodiment of the present invention.
Figure 3:
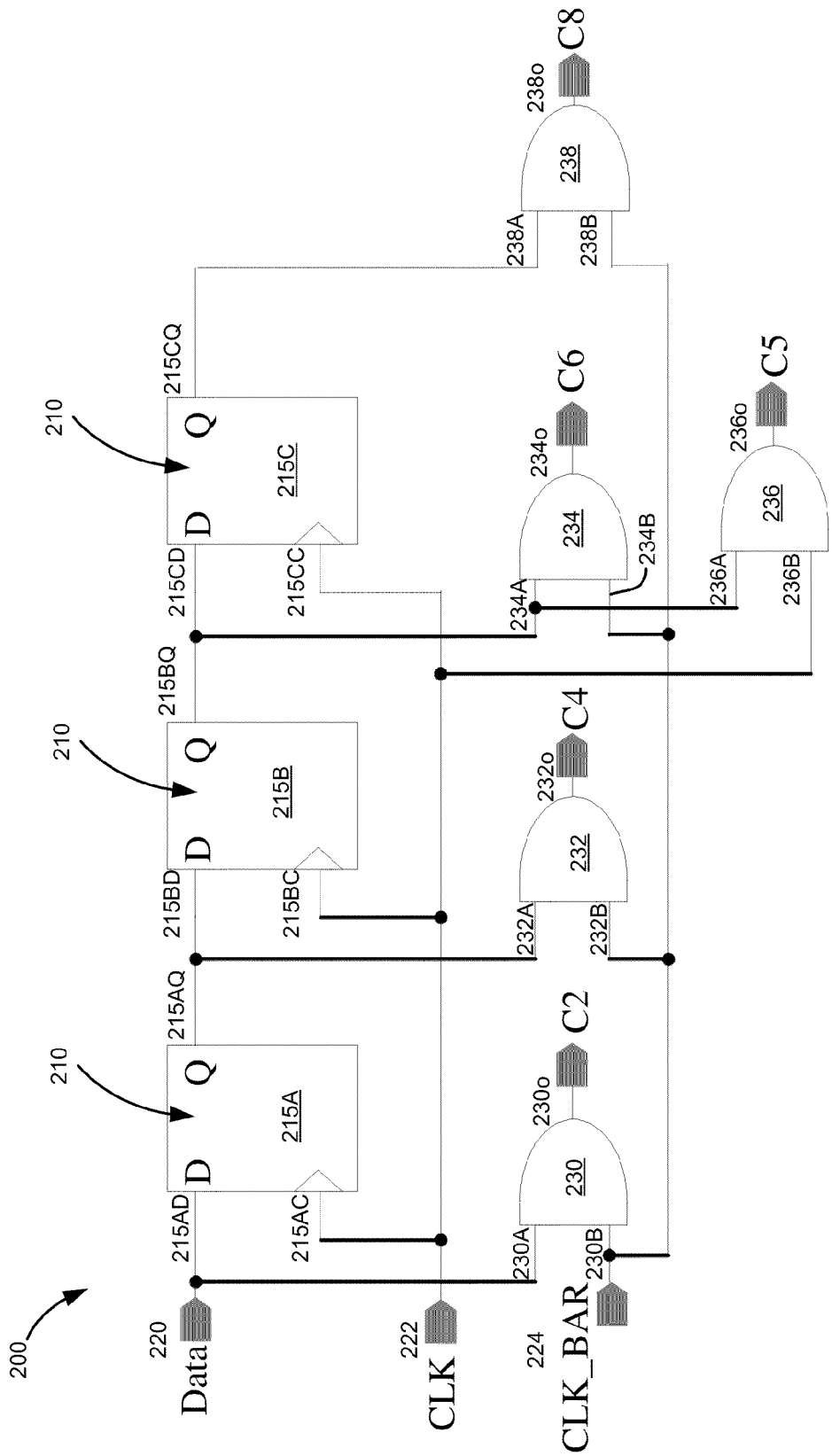
FIG. 3 is a schematic of a delay system, in accordance with an exemplary embodiment of the present invention.
Figure 4:
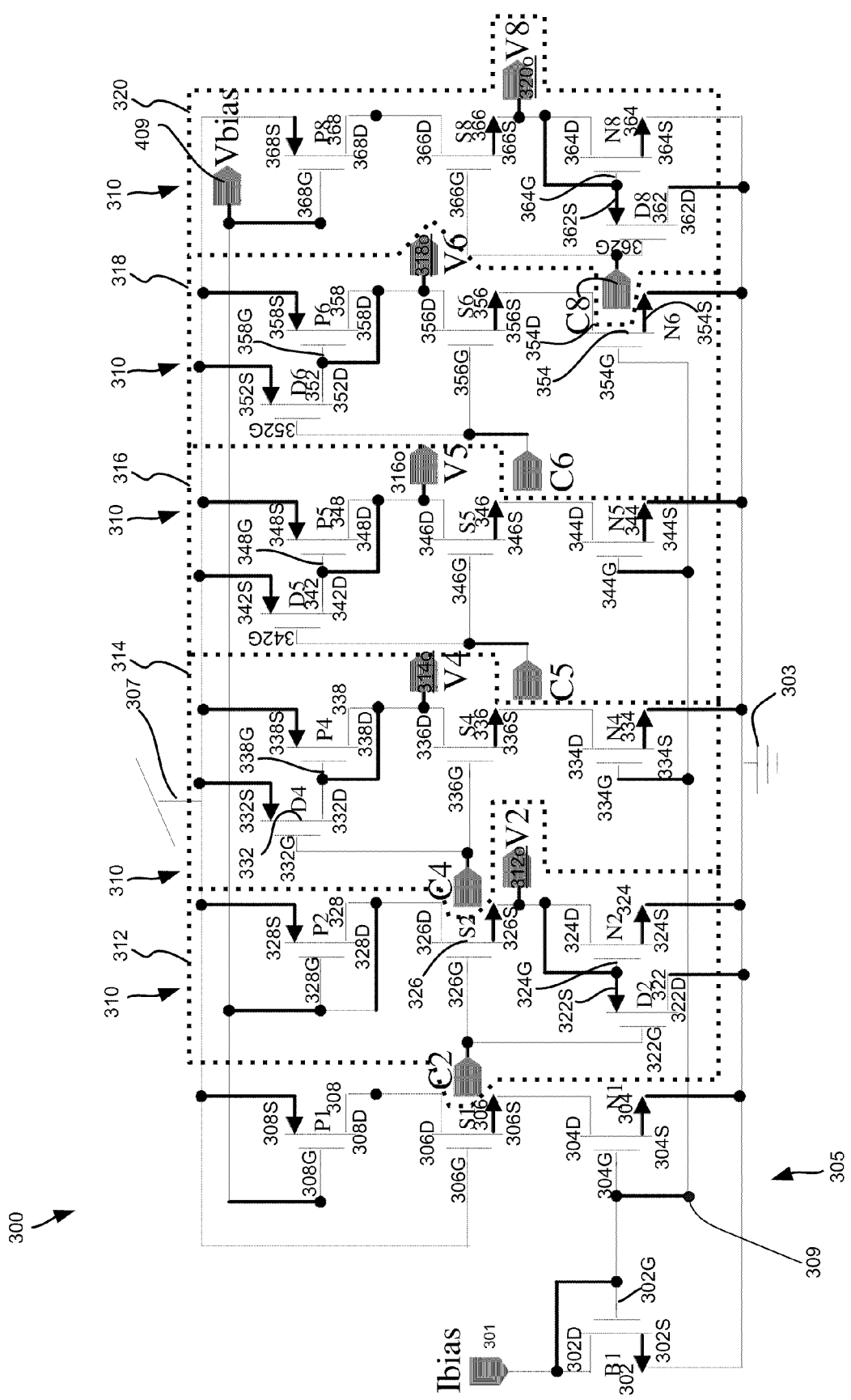
FIG. 4 is a schematic of a multiplier system, in accordance with an exemplary embodiment of the present invention.
Figure 5:
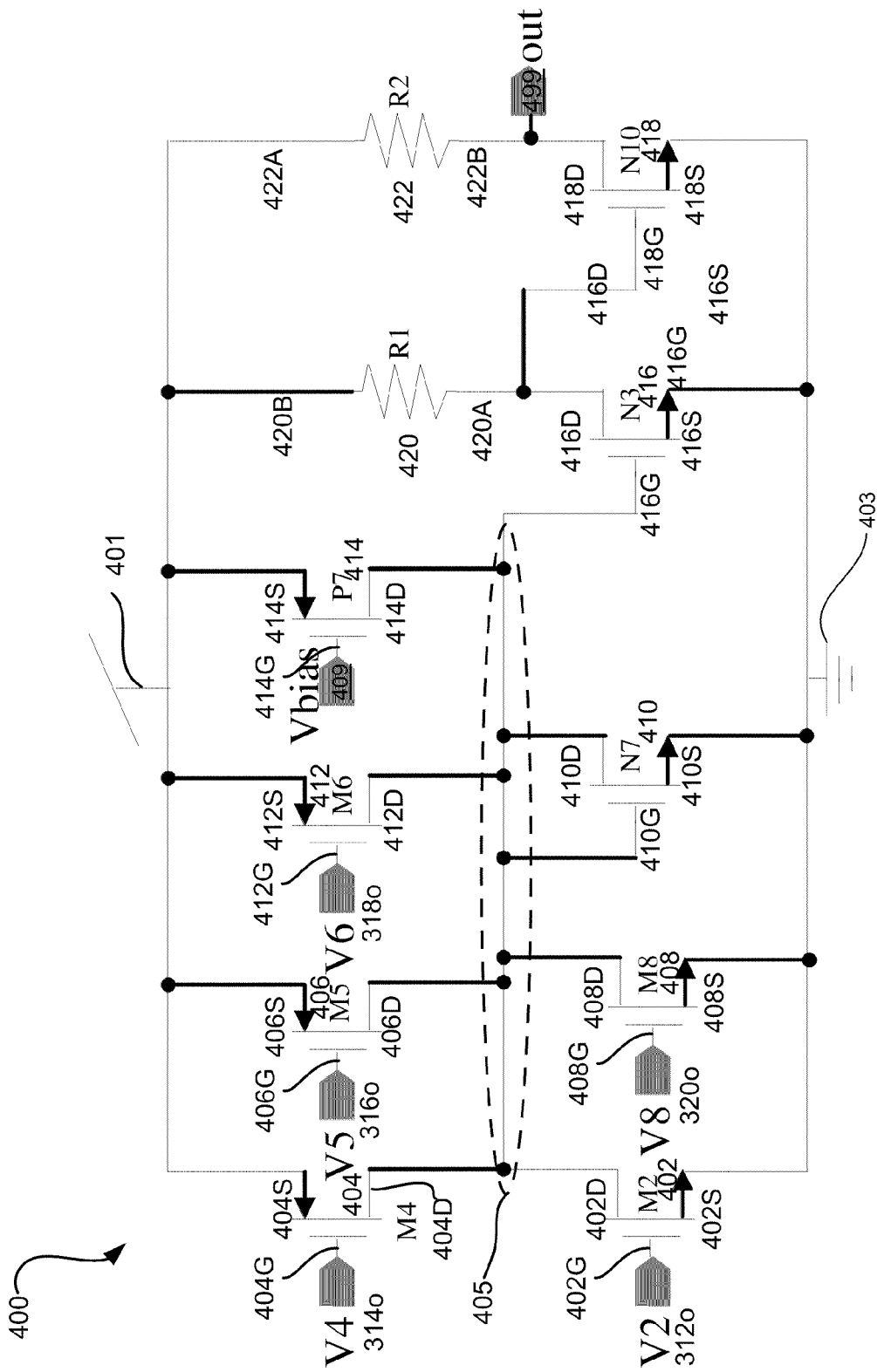
FIG. 5 is a schematic of a summing system, in accordance with an exemplary embodiment of the present invention.

As illustrated in FIG. 2, the pulse shape filter 100 comprises an input signal 102, a delay system 200, a multiplier system 300, and an adding or summing system 400. An exemplary embodiment of the delay system 200 is illustrated in FIG. 3, an exemplary embodiment of the multiplier system 300 is illustrated in FIG. 4, and an exemplary embodiment of the adding or summing system 400 is illustrated in FIG. 5. The exemplary embodiments illustrated in FIGS. 3-5 illustrate characteristics that are desirable for an exemplary implementation, such that the duplications illustrated can be increased or decreased based on the number of taps and the number of non-zero coefficients.

The delay system 200 includes a plurality of delays 210. For instance, the delay system 200 can include a digital delay chain with half of the symbol period being required first, wherein $\tau_s/2$. As shown in FIG. 3, this delay chain can be implemented with a plurality of D-flip-flops 215. The delay system 200 can receive the data signal 220, the clock signal (CLK) 222, and the CLK_BAR signal 224, all from the input signal 102.

As illustrated in FIG. 3, each D-flip flop includes at least a D input, a Q output, and a clock (CLK) input. In an exemplary embodiment, the data 220 from the input signal 102 is coupled to the D input 215AD of a first D-flipflop 215A. The CLK signal 222 from the input signal 102 is coupled to a clock input 215AC of the first D-flipflop 215A. A Q output 215AQ of the first D-flipflop 215A is a first input 232A of a second AND gate 232 and the CLK_BAR input 224 is a second input 232B of the second AND gate 232. The single output 232o of the second AND gate 232 is a data point (e.g., C4).

The number of D-flipflops required in the delay system 200 can be determined by the position of the last non-zero coefficient. For example, as illustrated in FIG. 3, five non-zero coefficients are present.

In an exemplary embodiment wherein there are five non-zero coefficients, data 220 from the input signal 102 is coupled to a first input 230A of a first AND gate 230 and the CLK_BAR signal 224 is coupled to a second input 230B of the first AND gate 230. The output 230o of the first AND gate 230 is a first data point (e.g., C2). In addition, data 220 from the input signal 102 is coupled to the D input 215AD of a first D-flipflop 215A. The CLK signal 222 from the input signal 102 is coupled to the clock input 215AC of the first D-flipflop 215A. A Q output 215AQ of the first D-flipflop 215A is a first input 232A to the second AND gate 232 and the CLK_BAR input 224 from the input signal 102 is the second input 232B to the second AND gate 232. The single output 232o of the second AND gate 232 is a second data point (e.g., C4). The Q output 215AQ of the first D-flipflop 215A is coupled to a D input 215BD of a second D-flipflop 215B. The CLK signal 222 is coupled to the clock input 215BC of the second D-flip flop 215B. The Q output 215BQ is coupled to a first input 234A of a third AND gate 234 and the CLK_BAR signal 224 is coupled to a second input 234B of the third AND gate 234. An output 234o of the third AND gate 234 is a third data point (e.g., C6). Further, the Q output 215BQ of the second D-flip-flop 215B is a first input 236A to a fourth AND gate 236 and the CLK signal 222 is a second input 236B to the fourth AND gate 236. An output 236o of the fourth AND gate 236 is a fourth data point (e.g., C5). The Q output 215BQ of the second D-flipflop 215B is coupled to a D input 215CD of a third D-flipflop 215C. The CLK signal 222 is coupled to a clock input 215CC of the third D-flipflop 215C. A Q output 215CQ of the third D-flipflop 215C is a first input 238A to a fifth AND gate 238 and the CLK_BAR signal 224 is a second input 238B of the fifth AND gate 238. An output 238o of the fifth AND gate 238 is a fifth data point (e.g., C8).

Each of the data points 230o, 232o, 234o, 236o, and 238o (i.e., C2, C4, C5, C6, and C8) are coupled to the multiplier system 300, as illustrated in FIG. 4.

FIG. 4 illustrates the multiplier system 300. The multiplier system 300 includes a current reference branch 305 that is coupled to at least one branch system 310. The number of branch systems 310 in the multiplier system 300 can be dependent on the number of non-zero coefficients. As illustrated in FIG. 4, in an exemplary embodiment, there are five non-zero coefficients. Each branch system 310 includes at least one NMOS transistor (Ni) comprising a drain, a gate, and a source; at least one NMOS switch (Si) comprising a drain, a gate, and a source; and at least one PMOS transistor (Pi) comprising a source, a gate, and a drain.

In its simplest implementation, the multiplier system 300 includes a current reference branch 305 and a single branch system 310. In such an example, the current reference branch 305 comprises a current 301, a transistor 302, a NMOS transistor 304, a NMOS switch 306, and a PMOS transistor 308.

As shown in FIG. 4, the current (Ibias) 301 can be received by the current reference branch 305. The current (Ibias) 305 is coupled to a drain 302D (please correct in figure also) and a gate 302G of a transistor 302 (B1). The source 302S of the transistor 302 (B1) is coupled to a ground 303. The gate 302G of the transistor 302 (B1) is coupled to a gate 304G of an NMOS transistor 304 (N1), which is coupled to a gate node 309. A source 304S of the NMOS transistor 304 (N1) is coupled to the ground 303. A drain 304D of the NMOS transistor 304 (N1) is coupled to a source 306S of a NMOS switch 306 (S1). A gate 306G of the NMOS switch 306 (S1) is coupled to the voltage supply 307. A drain 306D of the NMOS switch (S1) is coupled to a drain 308D and a gate 308G of the PMOS transistor 308 (P1) and the voltage 409 (Vbias). The source 308S of the PMOS transistor 308 (P1) is coupled to the voltage supply 307.

The branch system 310 comprises at least a PMOS transistor (Pi) comprising a source, a gate, and a drain; a NMOS switch (Si) comprising a drain, a gate, and a source; a NMOS transistor (Ni) comprising a drain, a gate, and a source; and a transistor (Di) comprising a source, a gate, and a drain.

A first branch system 312 receives a first non-zero (e.g., negative) coefficient (i.e., C2) that is coupled to a gate 326G of a NMOS switch 326 (S2) and a gate 322G of a transistor 322 (D2). A drain 322D of the transistor 322 (D2) is coupled to the ground 303 and a source 322S of the transistor 322 (D2) is coupled to a gate 324G of a NMOS transistor 324 (N2) and a drain 324D of the NMOS transistor 324 (N2). The source 324S of the NMOS transistor 324 (N2) is coupled to the ground 303, and the drain 324D of the NMOS transistor 324 (N2) is coupled to an output 312o (V2). The gate 324G of the NMOS transistor 324 (N2), the source 322S of the transistor 322 (D2), and a source 326S of the NMOS switch 326 (S2) are also coupled to the output 312o (V2). The drain 326D of the NMOS switch 326 (S2) is coupled to a drain 328D of the PMOS transistor 328 (P2). A gate 328G of the PMOS transistor 328 (P2) is coupled to the voltage 409 (Vbias). The source 328S of the PMOS transistor 328 (P2) is coupled to the voltage supply 307.

A second branch system 314 receives a second non-zero (e.g., positive) coefficient (i.e., C4), which is coupled to a gate 332G of a transistor 332 (D4) and a gate 336G of a NMOS switch 336 (S4). A source 332S of the transistor 332 (D4) is coupled to the voltage supply 307 and the drain 332D of the transistor 332 is coupled to a gate 338G of a PMOS transistor 338 (P4) and a drain 338D of the PMOS transistor 338 (P4). A source 338S of the PMOS transistor 338 (P4) is coupled to the voltage supply 307. The gate 338G of the PMOS transistor 338 (P4), and thus the drain 332D of the transistor 332 (D4), are coupled to an output of the branch 314o (V4) and a drain 336D of the NMOS switch 336 (S4). A source 336S of the NMOS switch (S4) is coupled to a drain 334D of a NMOS transistor 334 (N4). A gate 334G of the NMOS transistor 334 (N4) is coupled to the gate 304G of the NMOS transistor 304 (N1), i.e., a gate node 309. A source 334S of the NMOS transistor 334 (N4) is coupled to the ground 303.

A third branch system 316 receives a third non-zero (e.g., positive) coefficient (i.e., C5), which is coupled to a gate 342G of a transistor 342 (D5) and a gate 346G of a NMOS switch 346 (S5). A source 342S of the transistor 342 (D5) is coupled to the voltage supply 307 and the drain 342D of the transistor 342 is coupled to a gate 348G of a PMOS transistor 348 (P5) and a drain 348D of the PMOS transistor 348 (P5). A source 348S of the PMOS transistor 348 (P5) is coupled to the voltage supply 307. The gate 348G of the PMOS transistor 348 (P5), and thus the drain 342D of the transistor 342 (D5), are coupled to an output of the branch 316o (V5) and a drain 346D of the NMOS switch 346 (S5). A source 346S of the NMOS switch (S5) is coupled to a drain 344D of a NMOS transistor 344 (N5). A gate 344G of the NMOS transistor 344 (N5) is coupled to the gate 304G of the NMOS transistor 304 (N1), i.e., a gate node 309, and the gate 334G of the NMOS transistor 334 (N4). A source 344S of the NMOS transistor 344 (N5) is coupled to the ground 303.

A fourth branch system 318 receives a fourth non-zero (e.g., positive) coefficient (i.e., C6), which is coupled to a gate 352G of a transistor 352 (D6) and a gate 356G of a NMOS switch 356 (S6). A source 352S of the transistor 352 (D6) is coupled to the voltage supply 307 and the drain 352D of the transistor 352 is coupled to a gate 358G of a PMOS transistor 358 (P6) and a drain 358D of the PMOS transistor 358 (P6). A source 358S of the PMOS transistor 358 (P6) is coupled to the voltage supply 307. The gate 358G of the PMOS transistor 358 (P6), and thus the drain 352D of the transistor 352 (D6), are coupled to an output of the branch 318o (V6) and a drain 356D of the NMOS switch 356 (S6). A source 356S of the NMOS switch (S6) is coupled to a drain 354D of a NMOS transistor 354 (N6). A gate 354G of the NMOS transistor 354 (N6) is coupled to the gate 304G of the NMOS transistor 304 (N1), i.e., a gate node 309, and the gate 334G of the NMOS transistor 334 (N4). A source 354S of the NMOS transistor 354 (N6) is coupled to the ground 303.

A fifth branch system 320 receives a fifth non-zero (e.g., negative) coefficient (i.e., C8), which is coupled to a gate 366G of a NMOS switch 366 (S8) and a gate 362G of a transistor 362 (D8). A drain 362D of the transistor 362 (D8) is coupled to the ground 303 and a source 362S of the transistor 362 (D8) is coupled to a gate 364G of a NMOS transistor 364 (N8) and a drain 364D of the NMOS transistor 364 (N8). The source 364S of the NMOS transistor 364 (N8) is coupled to the ground 303, and the drain 364D of the NMOS transistor 364 (N8) is coupled to an output 320o (V8), which is also coupled to the source 362S of the transistor 362 (D8) and the gate 364G of the NMOS transistor 364 (N8). Accordingly, the gate 364G of the NMOS transistor 364 (N8), the source 362S of the transistor 362 (D8), the drain 364D of the NMOS transistor 364 (N8) and a source 366S of the NMOS switch 366 (S8) are all coupled to the output 312o (V8). The drain 366D of the NMOS switch 366 (S8) is coupled to a drain 368D of the PMOS transistor 368 (P8). The gate 368G of the PMOS transistor 368 (P8) is coupled to the voltage 409 (Vbias). The source 368S of the PMOS transistor 368 (P8) is coupled to the voltage supply 307.

The adding system 400 collects the outputs of all the branch systems 310, e.g., branch systems 312, 314, 316, 318, and 320, or outputs 312o, 314o, 316o, 318o, and 320o, respectively. The adding system can sum the outputs. As shown in FIG. 5, the adding system 400 can include a number of transistors and/or a number of resistors for summing the outputs of the branch systems.

As illustrated, the output 312o (V2) of the first branch 312 is coupled to a gate 402G of a first transistor 402 (M2), a drain 402D of the first transistor 402 (M2) is coupled to a first node 405, and a source 402S of the first transistor 402 (M2) is coupled to a ground 403. The output 314o (V4) of the second branch system 314 is coupled to the gate 404G of a second transistor 404 (M4), a source 404S of the second transistor 404 (M4) is coupled to a voltage supply 401, and a drain 404D of the second transistor 404 (M4) is coupled to the first node

405. The output 316o (V5) of the third branch system 316 is coupled to the gate 406G of a third transistor 406 (M5), a source 406S of the third transistor 406 (M5) is coupled to a voltage supply 401, and a drain 405D of the third transistor 406 (M5) is coupled to the first node 405. The output 318o (V6) of the fourth branch system 318 is coupled to the gate 412G of a fourth transistor 412 (M6), a source 412S of the fourth transistor 412 (M6) is coupled to a voltage supply 401, and a drain 412D of the fourth transistor 412 (M6) is coupled to the first node 405. The output 320o (V8) of the fifth branch 320 is coupled to a gate 408G of a fifth transistor 408 (M8), a drain 408D of the fifth transistor 408 (M8) is coupled to the first node 405, and a source 408S of the fifth transistor 408 (M8) is coupled to the ground 403. The voltage 409 (Vbias) is coupled to a gate 414G of a PMOS transistor 414 (P7), a source 414S of the PMOS transistor 414 (P7) is coupled to the voltage supply 401, and the drain 414D of the PMOS transistor 414 (P7) is coupled to the first node 405. The first node 405 is coupled to the drain 410D and the gate 410G of the transistor 410 (N7). The source 410S of the transistor 410 (N7) is coupled to the ground 403. The first node 405 is coupled to a gate 416G of a first NMOS transistor 416 (N3), a drain 416D of the NMOS transistor 416 (N3) is coupled to a first end 420A of a first resistor 420 (R1), a source 416S of the NMOS transistor 416 (N3) is coupled to the ground 403. A second end 420B of the first resistor 420 (R1) is coupled to the voltage supply 401. The first end 420A of the first resistor 420 (R1) is also coupled to the gate 418G of a second NMOS transistor 418 (N10), a drain 418D of the second NMOS transistor (N10) is coupled to the output 499 of the adding system 400, and a source 418S of the second NMOS transistor 418 (N10) is coupled to the ground 403. A second resistor 422 (R2) is coupled at a first end 422A to the voltage supply 401 and at a second end 422B to the output 499 of the adding system 400.

Example and Operation of Pulse Shape Filter 100

For example, for the pulse shape filter 100 consider a raised cosine pulse shaping filter implementation with nine taps having a roll-off factor of 0.25 with an upsampling factor of 2. For this example, the coefficients are predetermined as:

| | |
|---|---|
| C1 | −0.000 |
| C2 | −0.1856 |
| C3 | 0.0000 |
| C4 | 0.6274 |
| C5 | 1.0000 |
| C6 | 0.6274 |
| C7 | 0.0000 |
| C8 | −0.1856 |
| C9 | −0.000 |

Of the nine coefficients, five are non-zero coefficients.

The input signal 102 enters the delay system 200 comprising digital delay chain with half the symbol period ($\tau_s/2$). As shown in FIG. 3, this can be implemented with at least three D-flipflops 215. The delayed outputs are applied to AND gates as a first input along with either the CLK or CLK_BAR signals as the second input, so as to realize upsampling. In this example, only five data points are required because there are only five non-zero coefficients (see above). The actual implementation can have extra delay elements in the clock and data paths so as to compensate for unequal delays in different paths. Using the five data points generated by the digital delay line, the pulse-shaping filter is implemented using switched branch systems (i.e., current mirrors) shown in FIG. 4.

Each current mirror branch or branch system 310 in FIG. 4 includes at least one an NMOS transistor (Ni), an NMOS switch (Si), and a PMOS transistor (Pi). In the branches representing negative coefficients C2 and C8 (i.e., branch systems 312 and 320), the current is set by its PMOS transistor (i.e., PMOS transistor 328 (P2) and PMOS transistor 368 (P8), respectively). The NMOS switches 326 (S2) and 366 (S8) are controlled by the data points C2 and C8 from derived from the delay system 200 (see, e.g., FIG. 3). The diode-connected NMOS transistors 324 (N2) and 364 (N8) can generate the control voltages V2 and V8 (or outputs 312o and 320o of the branch systems 312 and 320, respectively) that determine if the appropriate currents have to be steered away from the drain current of the diode-connected NMOS transistor 410 (N7) in FIG. 5.

Still referring to FIG. 4, in the branch systems representing the positive coefficients (i.e., branch systems 314, 316, and 318), the current is set by the signals C4, C5, and C6 and the NMOS transistors 334 (N4), 344 (N5), and 354 (N6), respectively. The NMOS switches 336 (S4), 346 (S5), and 356 (S6) can be controlled by data points C4, C5, and C6 derived from the delay system (see e.g. FIG. 3). The PMOS transistors 338 (P4), 348 (P5), and 358 (P6) can generate the control voltages V4, V5, and V6 (or outputs 314o, 316o, and 318o of the branch systems 314, 316, and 318, respectively) to add appropriately scaled currents to the NMOS transistor 410 (N7) in FIG. 5 using transistors 404 (M4), 406 (M5), and 412 (M6). Accordingly, the current summing can be implemented in the diode-connected NMOS transistor 410 (N7). The output current is mirrored into the NMOS transistors 416 (N3), converted into a voltage level—using the first resistor 420 (R1)—and then amplified again by using the NMOS transistor 418 (N10) and the second resistor 422 (R2).

Figure 6:
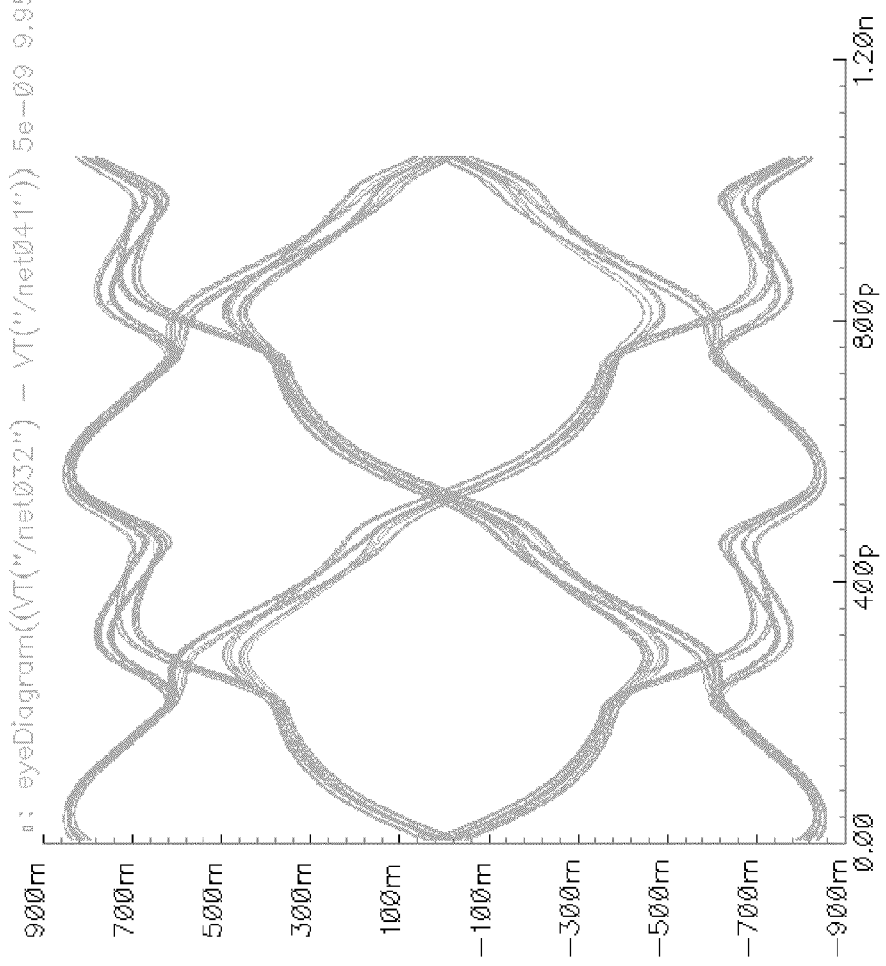
FIG. 6 is a graphical representation of a simulated eye-diagram of a differential pulse shaping filter implementation with an analog process, in accordance with an exemplary embodiment of the present invention.
Figure 7:
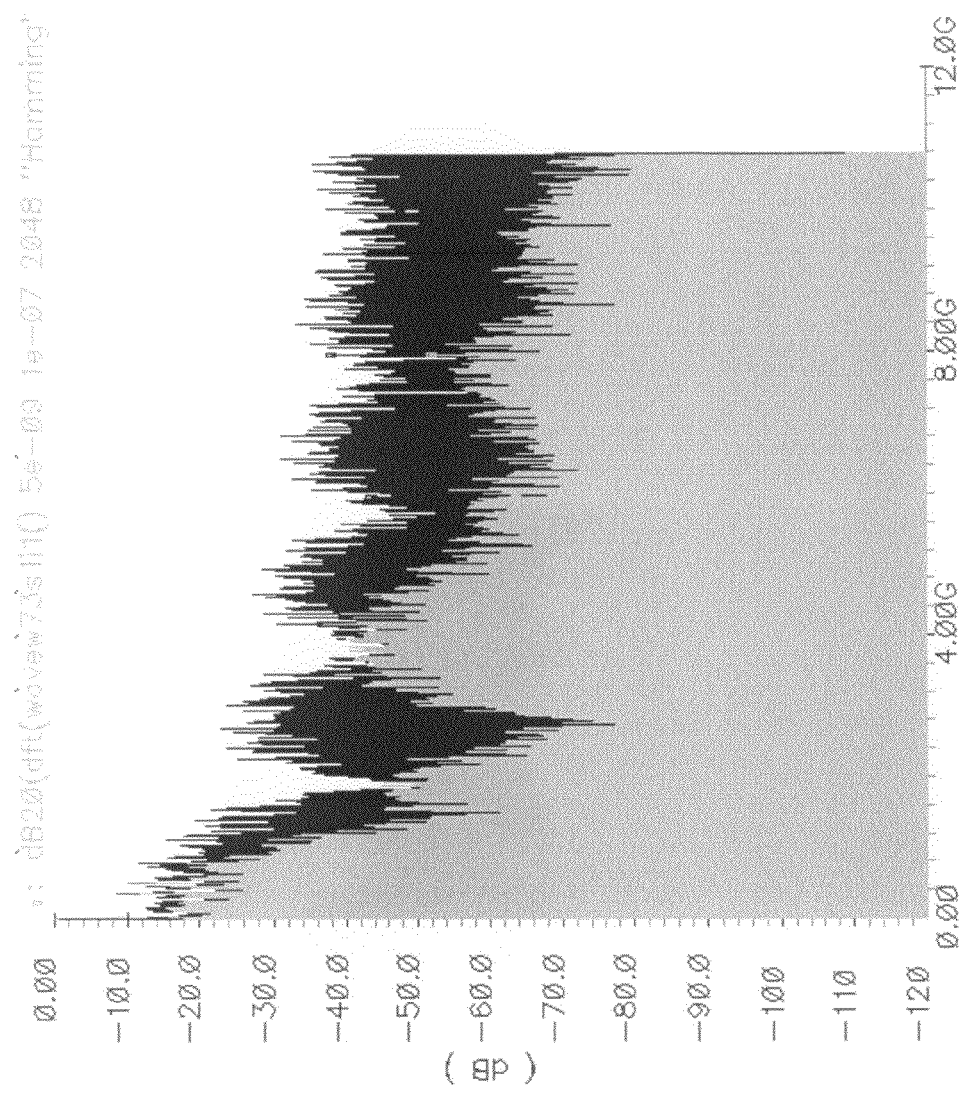
FIG. 7 is a graphical representation of a simulated baseband signal spectrum before and after entering the pulse shaping filter, in accordance with an exemplary embodiment of the present invention.

Referring back to FIG. 4, in order to enable operation at multi-giga bits per second, auxiliary charging and discharging paths are provided using PMOS transistors 322 (D2), 332 (D4), 342 (D5), 352 (D6), and 362 (D8). These transistors improve the output voltage waveform when operating at high speeds. The simulated eye-diagram of a differential pulse-shaping filter implemented using switched current mirrors (i.e., branch systems) (see FIG. 4) and delay chain (FIG. 3) is depicted in FIG. 6. A differential structure can avoid clock leakage into the output spectrum. The spectrum of the signals before and after pulse shaping is shown in FIG. 7. Notably, FIGS. 6-7 are simulated with a 1.9 Gbps symbol rate.

Figure 8:
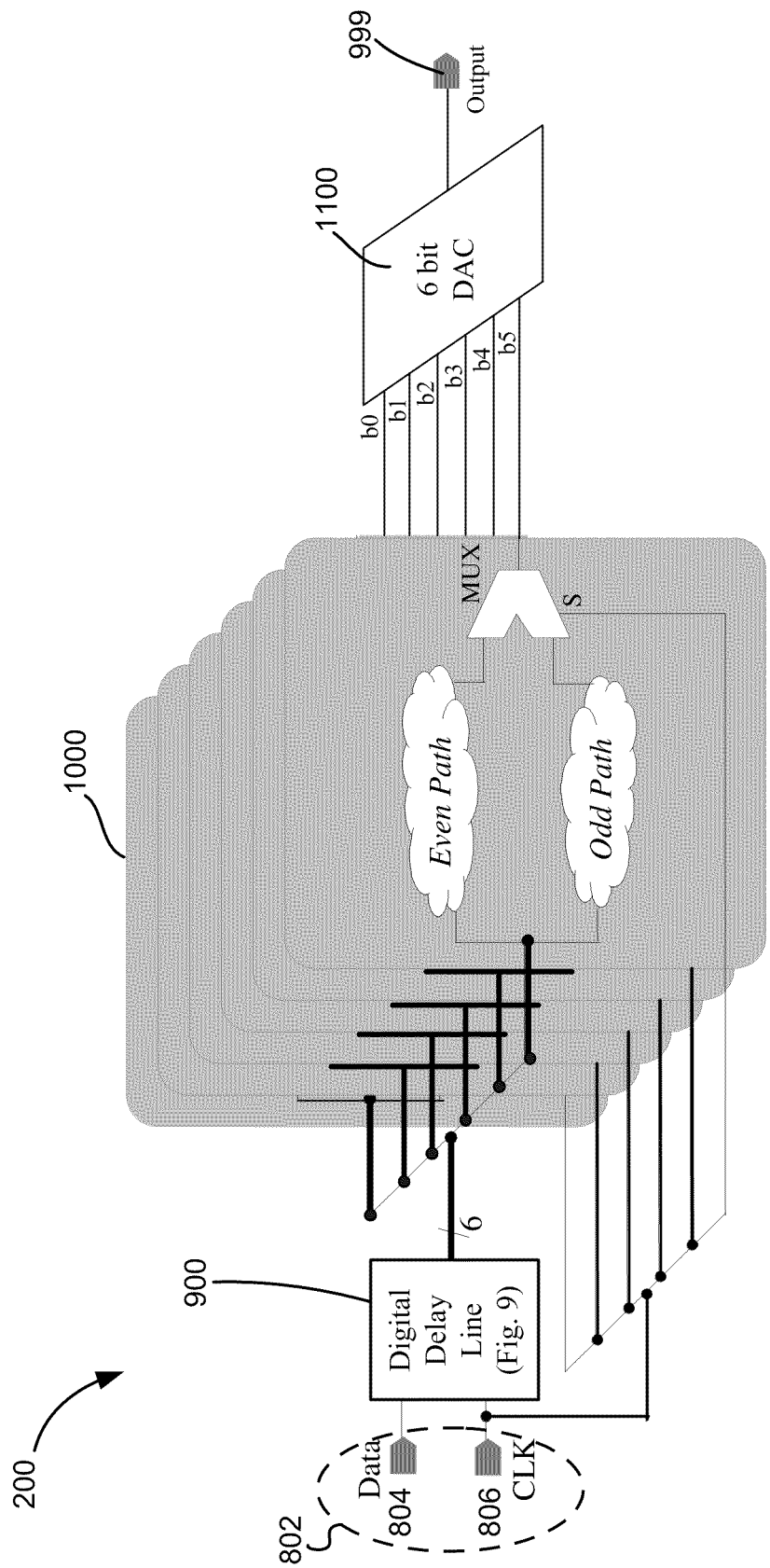
FIG. 8 is a schematic of a cosine pulse shaping filter in a digital implementation, in accordance with an exemplary embodiment of the present invention.
Figure 9:
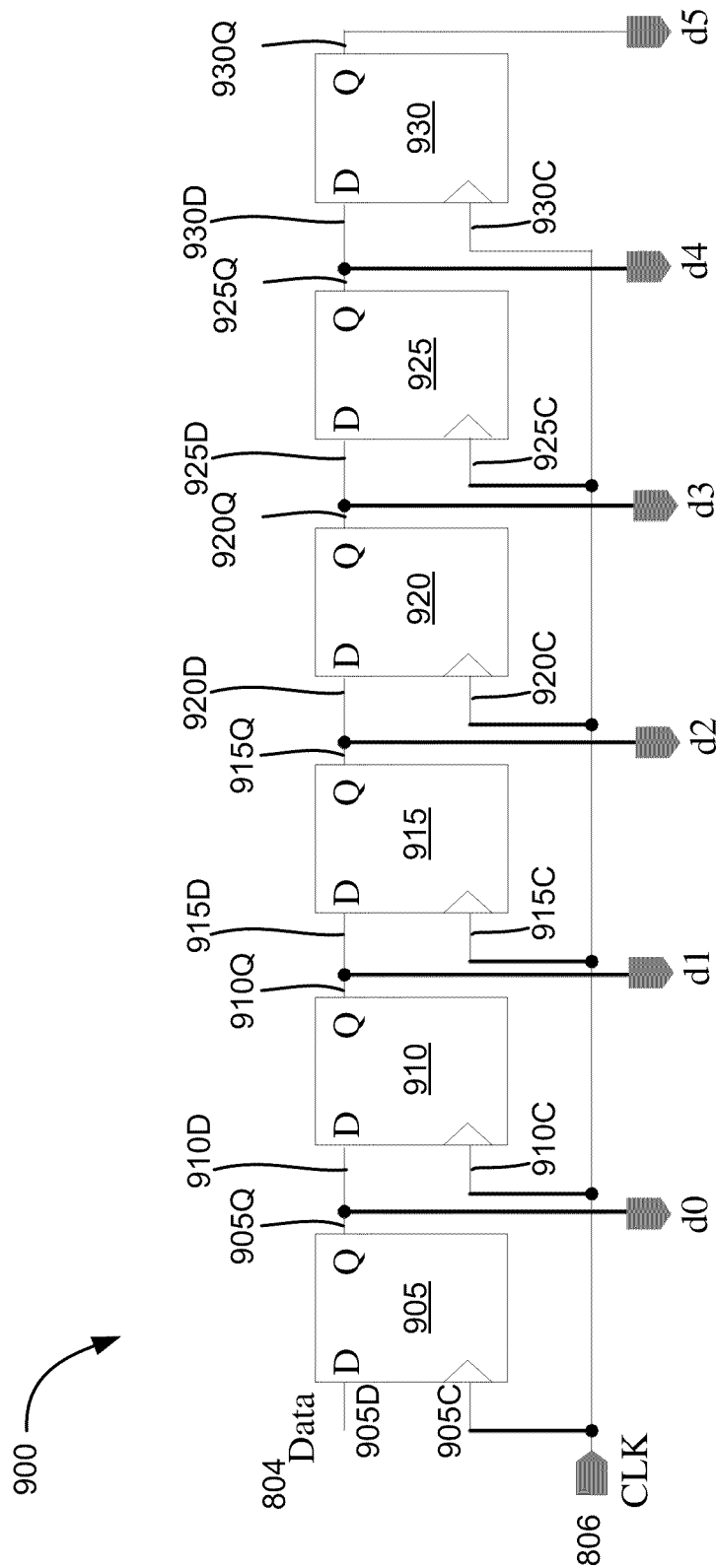
FIG. 9 is a schematic of a delay system for generating a six-bit address, in accordance with an exemplary embodiment of the present invention.

As illustrated in FIGS. 8-9, exemplary embodiments of the present invention relate to a system and method of implementing a pulse shape filter 200 in the digital domain. The system and method implement a look-up table of the size $2^{(m-1)/2}$ for this m-tap pulse shape filter in the digital domain.

In the analog system (e.g., pulse shape filter 100), i.e., the switched current mirror implementation or the branch system implementation, the upsampling can be achieved in the delay chain shown in FIG. 3. Another system and method to implement upsampling by a factor of N is to have N parallel paths and then do a parallel to serial conversion at the end.

As shown in FIG. 8, the pulse shape filter 200 is illustrated in an exemplary embodiment. The number of paths, illustrated in FIG. 8 as having six paths, can vary depending on the desired accuracy of the output digital to analog converter.

In an exemplary embodiment, the pulse shape filter 200 in a digital domain includes a delay system 900, a processing system 1000, and a n-bit digital to analog (DAC) converter 1100.

An input signal 802 includes both a data signal 804 and a CLK signal 806. The data signal 804 is coupled to a first input of the delay system 900, and the CLK signal 806 is coupled to a second input of the delay system 900. For example, as illustrated in FIG. 9, the delay system 900 can include a plurality of D-flipflops. In an exemplary embodiment, the delay system 900 can be referred to as a digital delay line comprising a plurality of D-flipflops daisy chained together. In an exemplary embodiment, the number of D-flipflops is dependent on the number of filter taps. For example, as illustrated in FIG. 9, there can be six D-flipflops in the 13-tap pulse shaping filter being implemented.

The data signal 804 is coupled to a D input 905D of a first D-flipflop 905. The CLK signal 806 is coupled to a clock input 905C of the first D-flipflop 905. A Q output 905Q of the first D-flipflop 905 is a first data point (d0). The Q output 905Q of the first D-flipflop 905 is coupled to a D input 910D of a second D-flipflop 910. The CLK signal 806 is coupled to a clock input 910C of the second D-flipflop 910. A Q output 910Q of the second D-flipflop 910 is a second data point (d1). The Q output 910Q of the second D-flipflop 910 is coupled to a D input 915D of a third D-flipflop 915. The CLK signal 806 is coupled to a clock input 915C of the third D-flipflop 915. A Q output 915Q of the third D-flipflop 915 is a third data point (d2). The Q output 915Q of the third D-flipflop 915 is coupled to a D input 920D of a fourth D-flip-flop 920. The CLK signal 806 is coupled to a clock input 920C of the fourth D-flipflop 920. A Q output 920Q of the fourth D-flipflop 920 is a fourth data point (d3). The Q output 920Q of the fourth D-flipflop 920 is coupled to a D input 925D of a fifth D-flipflop 925. The CLK signal 806 is coupled to a clock input 925C of the fifth D-flipflop 925. A Q output 925Q of the fifth D-flipflop 925 is a fifth data point (d4). The Q output 925Q of the fifth D-flipflop 925 is coupled to a D input 930D of a sixth D-flipflop 930. The CLK signal 806 is coupled to a clock input 930C of the sixth D-flipflop 930. A Q output 930Q of the sixth D-flipflop 930 is a sixth data point (d5).

The outputs from the delay system 900 are the delayed versions of the input bit stream. Each DAC input bit in FIG. 8, e.g., b0, b1, b2, b3, b4, and b5, is an output of the processing system 1000, which is a function of the outputs of 900. Each DAC input bit can be evaluated using Even paths and Odd paths, based on its numbered coefficient. As a result, by processing the outputs of the delay chain, the size of the lookup table can be reduced from $2^m$ to $2^{(m-1)/2}$ for an m-tap pulse shaping filter. These signals are ultimately input into a MUX with the CLK signal 806 which performs the upsampling. A 2-input MUX can perform an upsampling by a factor of 2. Similarly, an N-input MUX can perform an upsampling by a factor of N. Each of these outputs is a bit to the n-bit DAC 1100. The output 999 of the DAC is also the output of the pulse shaping filter 800.

Example and Operation of Pulse Shape Filter 200

For example, this technique can be used in implementing a 13-tap raised cosine filter with a roll-off factor of 0.3235. The tap coefficients in this example are:

| | |
|---|---|
| C1 | 0.0000 |
| C2 | 0.0650 |
| C3 | −0.0000 |
| C4 | −0.1691 |
| C5 | 0.0000 |
| C6 | 0.6212 |
| C7 | 1.0000 |
| C8 | 0.6212 |
| C9 | 0.0000 |
| C10 | −0.1691 |
| C11 | −0.0000 |
| C12 | 0.0650 |
| C13 | 0.0000 |

Because the upsampling factor is two, the coefficients are divided into two sets:
Odd: [0.0000 (C1), 0.0000 (C3), 0.0000 (C5), 1.0000 (C7), 0.0000 (C9), 0.0000 (C11), 0.0000 (C13)]; and
Even: [0.0650 (C2), −0.1691 (C4), 0.6212 (C6), 0.6212 (C8), −0.1691 (C10), 0.0650 (C12)]

Because there is a single non-zero coefficient in the Odd set, the output of this path is solely C7, which is the input data delayed by three time periods. The output of the Even path can be any one of the $2^6$ possible outcomes because there are six non-zero coefficients. For example if the last bits were all 1s, the output would be:
0.0650−0.1691+0.6212+0.6212−0.1691+0.0650=1.0342
and so on.

In operate to run at extremely high speeds, all the possible $2^6$ outcomes can be precalculated and stored at addresses representing the last 6 data inputs. Table 1 (below) lists all the possible outcomes as 6 bit binary numbers (obtained after scaling and adding a bias). Also shown at the bottom of Table 1, are the 2 possible outcomes of the odd path.

TABLE 1

Precalculated 6 bit outcomes for all possible 6 bit data inputs.
Also shown are the 2 possible outcomes of the odd path.

| Address | Outcome | |
|---|---|---|
| 000000 | 010101 | |
| 000001 | 010111 | |
| 000010 | 010000 | |
| . | . | Even Coefficients Outcomes |
| . | . | |
| . | . | |
| 111101 | 111010 | |
| 111110 | 110011 | |
| 111111 | 110101 | |
| Odd (d3 = 0) | 010101 | Odd Coefficients Outcomes |
| Odd (d3 = 1) | 110100 | |

The digital delay chain implementing the 6-bit address is illustrated in FIG. 9. Each of the precalculated outcomes in the Even or Odd paths can be stored as a 6-bit word in memory. The use of memory, however, can be avoided if we determine each bit's outcome as an output of a combinational logic block with 6 inputs (i.e., the address bits). For example, this implementation is shown in FIG. 8.

Each of the 6 bits in the output word is evaluated as an output of the Even or Odd combinational block. Six multiplexers choose the results of the Odd path in the positive half of the clock cycle and the Even path in the negative half of the clock cycle. This parallel to serial conversion implements the upsampling. The 6-bit output word is fed to a digital-to-analog converter that generates the analog output.

The Even and Odd paths can have D flip-flops at their ends, so as to latch to the output. The clock applied to these D flip-flops can be delayed to compensate for the delay in the combinational blocks. The clock fed to the multiplexer select terminal is further delayed to compensate for the clock to output delay of the flip-flops at the output of Odd and Even paths.

Figure 10:
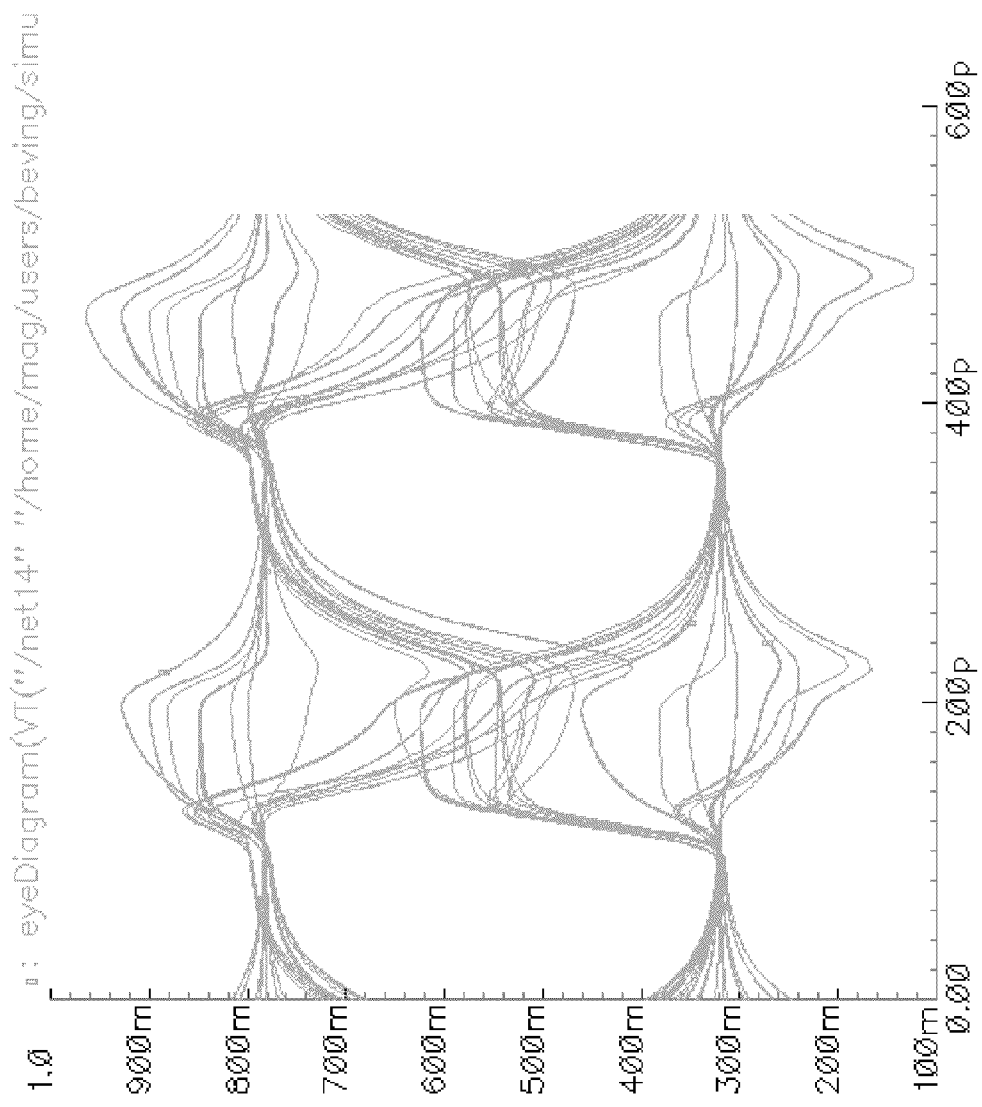
FIG. 10 is a graphical representation of a simulated eye-diagram of a cosine pulse shaping filter implementation with a digital process, in accordance with an exemplary embodiment of the present invention.
Figure 11:
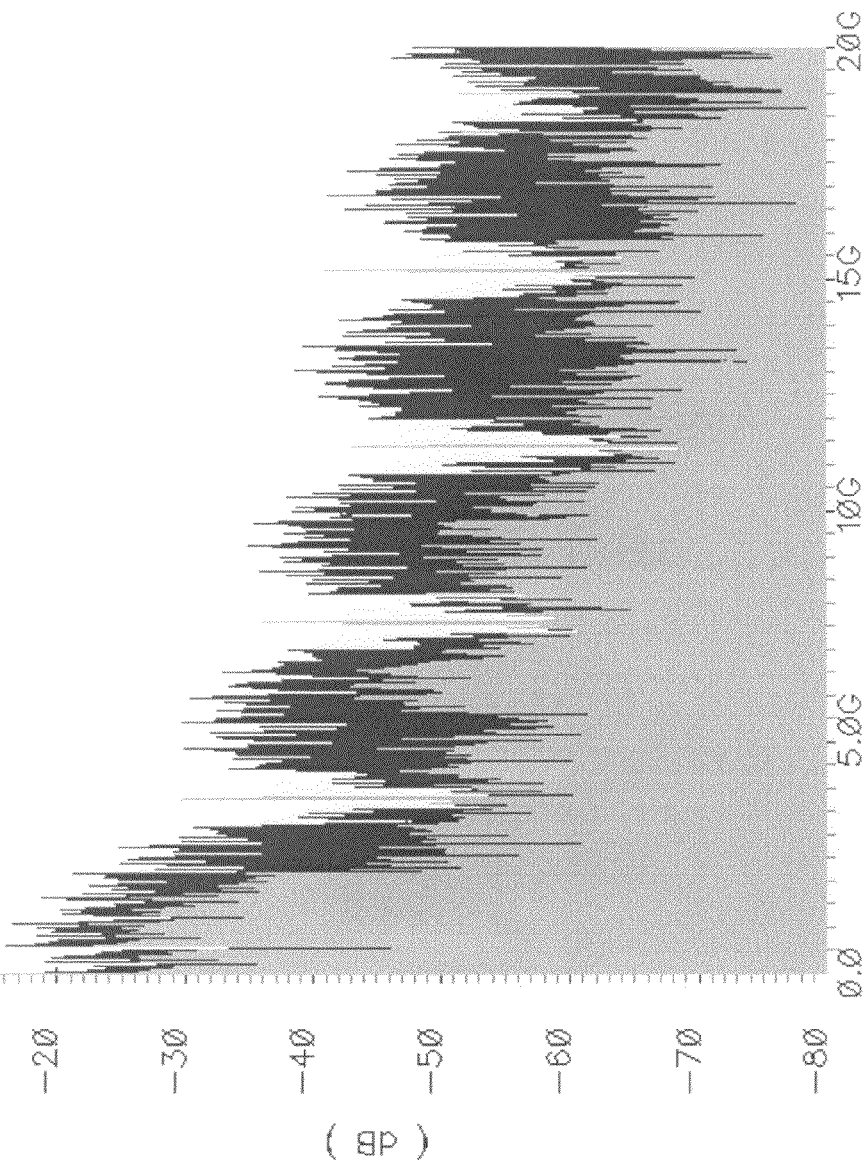
FIG. 11 is a graphical representation of a signal spectrum before and after filtering, in accordance with an exemplary embodiment of the present invention.

Using the topology described in FIG. 8, a 13-tap raised cosine filter is designed for a roll-off factor of 0.3235 and an upsampling factor of 2. The simulated eye-diagram for a data rate of 3.8 Gbps is shown in FIG. 10. The signal spectrum before and after filtering is shown in FIG. 11. The filter includes some clock feedthrough, which may be avoided by using differential filters as explained above.

While exemplary embodiments of the present invention have been disclosed herein, it will be apparent to those skilled in the art that many modifications, additions, and deletions can be made therein without departing from the spirit and scope of the invention and its equivalents, as set forth in the following claims.

What is claimed is:

1. A pulse shaping filter comprising:
a delay system comprising a digital delay chain;
a multiplier system comprising at least one multiplier adapted to multiply a signal from an input signal or the delay system by a predetermined non-zero coefficient, the multiplier system comprising a current reference branch and at least one current branch system coupled to the current reference; and
an adding system for summing each output of each multiplier of the multiplier system,
wherein the current reference branch is adapted to receive a biasing current and the current reference branch comprises:
a first PMOS transistor comprising a first PMOS source, a first PMOS gate, and a first PMOS drain;
a first NMOS transistor comprising a first NMOS transistor source, a first NMOS transistor gate, and a first NMOS transistor drain; and
a first NMOS switch comprising a first NMOS switch source, first NMOS switch gate, and a NMOS switch drain, and
wherein the first PMOS drain is electrically coupled to the first NMOS switch drain and the first NMOS switch source is electrically coupled to the first NMOS transistor drain.

2. The pulse shaping filter of claim 1, the digital delay chain comprising a plurality of delays.

3. The pulse shaping filter of claim 2, the number of the plurality of delays dependent on a position of the last non-zero coefficient.

4. The pulse shaping filter of claim 1,
the digital delay chain comprising a plurality of D-flipflops coupled to a plurality of logical AND gates for performing delays and obtaining a unit delay of half the symbol period by ANDing delayed signals with CLK and CLK_bar signals.

5. The pulse shaping filter of claim 1, the current reference branch further comprising:
a first transistor comprising a first source, a first drain, and a first gate,
wherein:
the biasing current is coupled to the first drain and the first gate of the first transistor,
the first source of the first transistor is coupled to a ground;
the first gate of the first transistor is further coupled to a first NMOS transistor gate of the NMOS transistor,
the first NMOS transistor gate of the first NMOS transistor is coupled to a gate node,
the first NMOS transistor source of the first NMOS transistor is coupled to the ground,
the first NMOS transistor drain of the first NMOS transistor is coupled to the NMOS switch source of the first NMOS switch,
the first NMOS switch gate of the first NMOS switch is coupled to a voltage supply,
the first NMOS switch drain of the first NMOS switch is coupled to the first PMOS drain and the first PMOS gate of the first PMOS transistor and a voltage (Vbias), and
the first PMOS source of the first PMOS transistor is coupled to the voltage supply.

6. The pulse shaping filter of claim 1, the at least one branch system configured to receive the predetermined non-zero coefficient and comprising:
a second PMOS transistor comprising a second PMOS source, a second PMOS gate, and a PMOS drain;
a second NMOS transistor comprising a second NMOS transistor source, a second NMOS transistor gate, and a NMOS transistor drain; and
a second NMOS switch comprising a second NMOS switch source, second NMOS switch gate, and a second NMOS switch drain.

7. The pulse shaping filter of claim 6, the at least one branch system further comprising:
a second transistor comprising a second source, a second gate, and a second drain.

8. The pulse shaping filter of claim 7, the number of the at least one branch system is dependent on a number of predetermined non-zero coefficients.

9. The pulse shaping filter of claim 8, the transistors of the at least one branch system comprising quick charging and discharging transistors for speedy charging and discharging of nodes and enabling high speed operation.

10. The pulse shaping filter of claim 8, the adding system comprising an equal number of transistors as the number of predetermined non-zero coefficients.

11. The pulse shaping filter of claim 10, the adding system generating an output.

12. A pulse shaping filter operating in the digital domain comprising:
a delay system comprising a plurality of D-flipflops, the number of the plurality of D-flipflops dependent on the desired number of taps;
a processing system comprising a lookup table based digital implementation created by splitting processing paths into two paths and evaluating outputs in the two paths in advance; and
an n-bit digital to analog converter receiving n-bits output from the processing system for providing an output,
the processing system further comprising a dual-input MUX receiving the outputs of the lookup table and a clock signal for performing an upsampling.

13. The pulse shaping filter of claim 12, the lookup table processing outputs of the delay system is adapted to reduce the size of the lookup table from $2^m$ to $2^{(m-1)/2}$ for an m-tap pulse shaping filter.

14. The pulse shaping filter of claim 12, the dual-input MUX adapted to perform the upsampling by a factor of two.

* * * * *